United States Patent
Inukai

(10) Patent No.: US 11,691,447 B2
(45) Date of Patent: *Jul. 4, 2023

(54) MOBILE DEVICE WITH BATTERY

(71) Applicant: SEIKO EPSON CORPORATION, Tokyo (JP)

(72) Inventor: Tomoya Inukai, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 121 days.

This patent is subject to a terminal disclaimer.

(21) Appl. No.: 17/083,380

(22) Filed: Oct. 29, 2020

(65) Prior Publication Data

US 2021/0129564 A1 May 6, 2021

(30) Foreign Application Priority Data

Oct. 31, 2019 (JP) ................................. 2019-198382

(51) Int. Cl.
| | |
|---|---|
| *H01M 10/46* | (2006.01) |
| *B41J 29/393* | (2006.01) |
| *B41J 3/36* | (2006.01) |
| *G06F 1/16* | (2006.01) |
| *B41J 2/045* | (2006.01) |
| *H02J 7/00* | (2006.01) |
| *H05K 5/00* | (2006.01) |
| *H04M 1/02* | (2006.01) |

(52) U.S. Cl.
CPC ........... *B41J 29/393* (2013.01); *B41J 2/0457* (2013.01); *B41J 3/36* (2013.01); *G06F 1/1635* (2013.01); *H02J 7/0042* (2013.01); *H02J 7/0044* (2013.01); *H02J 7/0048* (2020.01); *H02J 7/0063* (2013.01); *B41J 2029/3932* (2013.01); *H04M 1/0262* (2013.01); *H05K 5/0086* (2013.01)

(58) Field of Classification Search
CPC ...... H02J 7/0042; H02J 7/0044; H02J 7/0048; H02J 7/0063; H04M 1/0262; B41J 3/36; B41J 2029/3932; B41J 29/393; B41J 2/0457; G06F 1/1635; H05K 5/0086
USPC .......................................... 320/107, 114, 115
See application file for complete search history.

(56) References Cited

U.S. PATENT DOCUMENTS

| | | | | |
|---|---|---|---|---|
| 2011/0286025 | A1* | 11/2011 | Silverbrook | ...... H04M 1/72412 358/1.14 |
| 2014/0002567 | A1* | 1/2014 | Miyabayashi | ............ H02J 7/00 347/211 |

FOREIGN PATENT DOCUMENTS

| | | |
|---|---|---|
| JP | H10-244730 A | 9/1998 |
| JP | 2010-055811 A | 3/2010 |

(Continued)

*Primary Examiner* — Edward Tso
(74) *Attorney, Agent, or Firm* — Global IP Counselors, LLP

(57) ABSTRACT

A liquid discharging apparatus includes a drive signal output circuit outputting a drive signal, a drive portion including a discharging head that discharges a liquid onto a medium based on the drive signal, a solid-state battery supplying electric power to the drive signal output circuit, a supporting portion supporting the drive signal output circuit, and a housing accommodating the drive signal output circuit, the drive portion, the solid-state battery, and the supporting portion, in which the housing includes a first housing surface that intersects a discharging direction, which is a direction in which the liquid is discharged from the discharging head, and the solid-state battery is positioned between the first housing surface and the supporting portion.

6 Claims, 10 Drawing Sheets

(56) References Cited

FOREIGN PATENT DOCUMENTS

| JP | 2016-175374 A | 10/2016 |
|----|---------------|---------|
| JP | 2019-067523 A | 4/2019  |

* cited by examiner

MOBILE DEVICE WITH BATTERY

The present application is based on, and claims priority from JP Application Serial Number 2019-198382, filed Oct. 31, 2019, the disclosure of which is hereby incorporated by reference herein in its entirety.

BACKGROUND

1. Technical Field

The present disclosure relates to a liquid discharging apparatus, a display apparatus, and a mobile device.

2. Related Art

A mobile device that is small and lightweight and has portability has been proposed in the related art. For example, JP-A-2016-175374 discloses a portable printing apparatus as an example of a mobile device.

The mobile device as described in JP-A-2016-175374 is small and lightweight, and is excellent in portability. Therefore, when compared with a stationary device, a shock such as a drop is likely to be applied. When a shock such as a drop is applied to the mobile device, an abnormality occurs in a circuit provided inside the mobile device or a battery that supplies electric power to the circuit, and there is a possibility that the performance of the mobile device is reduced due to the abnormality. However, JP-A-2016-175374 does not disclose any measures against a shock applied to a mobile device. That is, there is room for improvement from the viewpoint of reducing the influence of a shock on the mobile device such as a printing apparatus or a display apparatus having portability.

SUMMARY

According to an aspect of the present disclosure, there is provided a liquid discharging apparatus including: a drive signal output circuit outputting a drive signal; a drive portion including a discharging head that discharges a liquid onto a medium based on the drive signal; a solid-state battery supplying electric power to the drive signal output circuit; a supporting portion supporting the drive signal output circuit; and a housing accommodating the drive signal output circuit, the drive portion, the solid-state battery, and the supporting portion, in which the housing includes a first housing surface that intersects a discharging direction, which is a direction in which the liquid is discharged from the discharging head, and the solid-state battery is positioned between the first housing surface and the supporting portion.

In the liquid discharging apparatus, the housing may include a second housing surface that is connected to the first housing surface, and the solid-state battery may be positioned between a contact point, where the first housing surface and the second housing surface are connected to each other, and the supporting portion.

In the liquid discharging apparatus, the solid-state battery may include a first battery surface extending along a direction in which the first housing surface extends.

In the liquid discharging apparatus, the liquid discharging apparatus may include: a supply port supplying the medium to the housing; an exhaust port exhausting the medium from the housing; and a transport portion transporting the medium from the supply port toward the exhaust port, in which the supply port may be provided on a third housing surface that is different from the first housing surface and the second housing surface of the housing, the exhaust port may be provided on a fourth housing surface that is different from the first housing surface and the second housing surface of the housing, and the solid-state battery may include a second battery surface that is connected to the first battery surface and extends along a direction in which the second housing surface extends.

In the liquid discharging apparatus, the liquid discharging apparatus may include a fixing portion fixing the solid-state battery, in which the fixing portion may fix only a part of the solid-state battery.

In the liquid discharging apparatus, the fixing portion may fix the solid-state battery to the supporting portion.

In the liquid discharging apparatus, the supporting portion may be positioned between the drive signal output circuit and the solid-state battery.

According to another aspect of the present disclosure, there is provided a display apparatus including: a drive signal output circuit outputting a drive signal; a drive portion including a display portion that displays an image based on the drive signal; a solid-state battery supplying electric power to the drive signal output circuit; a supporting portion supporting the drive signal output circuit; and a housing accommodating the drive signal output circuit, the drive portion, the solid-state battery, and the supporting portion, in which the housing includes a first housing surface, in a direction intersecting a direction in which the first housing surface extends, at least parts of the first housing surface and the display portion are positioned to overlap each other, and the solid-state battery is positioned between the first housing surface and the supporting portion.

In the display apparatus, the housing may include a second housing surface that is connected to the first housing surface, and the solid-state battery may be positioned between a contact point, where the first housing surface and the second housing surface are connected to each other, and the supporting portion.

In the display apparatus, the solid-state battery may include a first battery surface that extends along a direction in which the first housing surface extends, and a second battery surface that is connected to the first battery surface and extends along a direction in which the second housing surface extends.

In the display apparatus, the display apparatus may include a fixing portion fixing the solid-state battery, in which the fixing portion may fix only a part of the solid-state battery.

In the display apparatus, the fixing portion may fix a part of the solid-state battery to the supporting portion.

In the display apparatus, the supporting portion may be positioned between the drive signal output circuit and the solid-state battery.

According to still another aspect of the present disclosure, there is provided a mobile device including: a drive signal output circuit outputting a drive signal; a drive portion operating based on the drive signal; a solid-state battery supplying electric power to the drive signal output circuit; a supporting portion supporting the drive signal output circuit; and a housing accommodating the drive signal output circuit, the drive portion, the solid-state battery, and the supporting portion, in which the housing includes a first housing surface, the supporting portion is positioned between the first housing surface and the drive signal output circuit, and the solid-state battery is positioned between the first housing surface and the supporting portion.

In the mobile device, the housing may include a second housing surface that is connected to the first housing surface, and the solid-state battery may be positioned between a contact point, where the first housing surface and the second housing surface are connected to each other, and the supporting portion.

In the mobile device, the solid-state battery may include a first battery surface that extends along a direction in which the first housing surface extends, and a second battery surface that is connected to the first battery surface and extends along a direction in which the second housing surface extends.

In the mobile device, the mobile device may include a fixing portion fixing the solid-state battery, in which the fixing portion may fix only a part of the solid-state battery.

In the mobile device, the fixing portion may fix a part of the solid-state battery to the supporting portion.

In the mobile device, the supporting portion may be positioned between the drive signal output circuit and the solid-state battery.

DESCRIPTION OF EXEMPLARY EMBODIMENTS

Hereinafter, preferred embodiments of the present disclosure will be described with reference to the drawings. The drawings used are for convenience of explanation. Note that the embodiments described below do not unduly limit the contents of the present disclosure described in the aspects. In addition, not all of the components described below are necessarily essential components requirements of the present disclosure.

1. First Embodiment

A mobile device of a first embodiment is a liquid discharging apparatus that forms a desired image on a medium by discharging ink as a liquid onto the medium, and a mobile type ink jet printer that can be carried by being operated by a battery will be described as an example. In the following description, a mobile type ink jet printer may be simply referred to as a mobile printer. Further, as a medium on which an image is formed by a mobile printer, a description will be made assuming plain paper which is used for printing characters or images or the like, glossy paper which is used for printing photographs or the like, postcards, or the like, but the medium is not limited to this.

1.1 Functional Configuration of Mobile Printer

Figure 1:
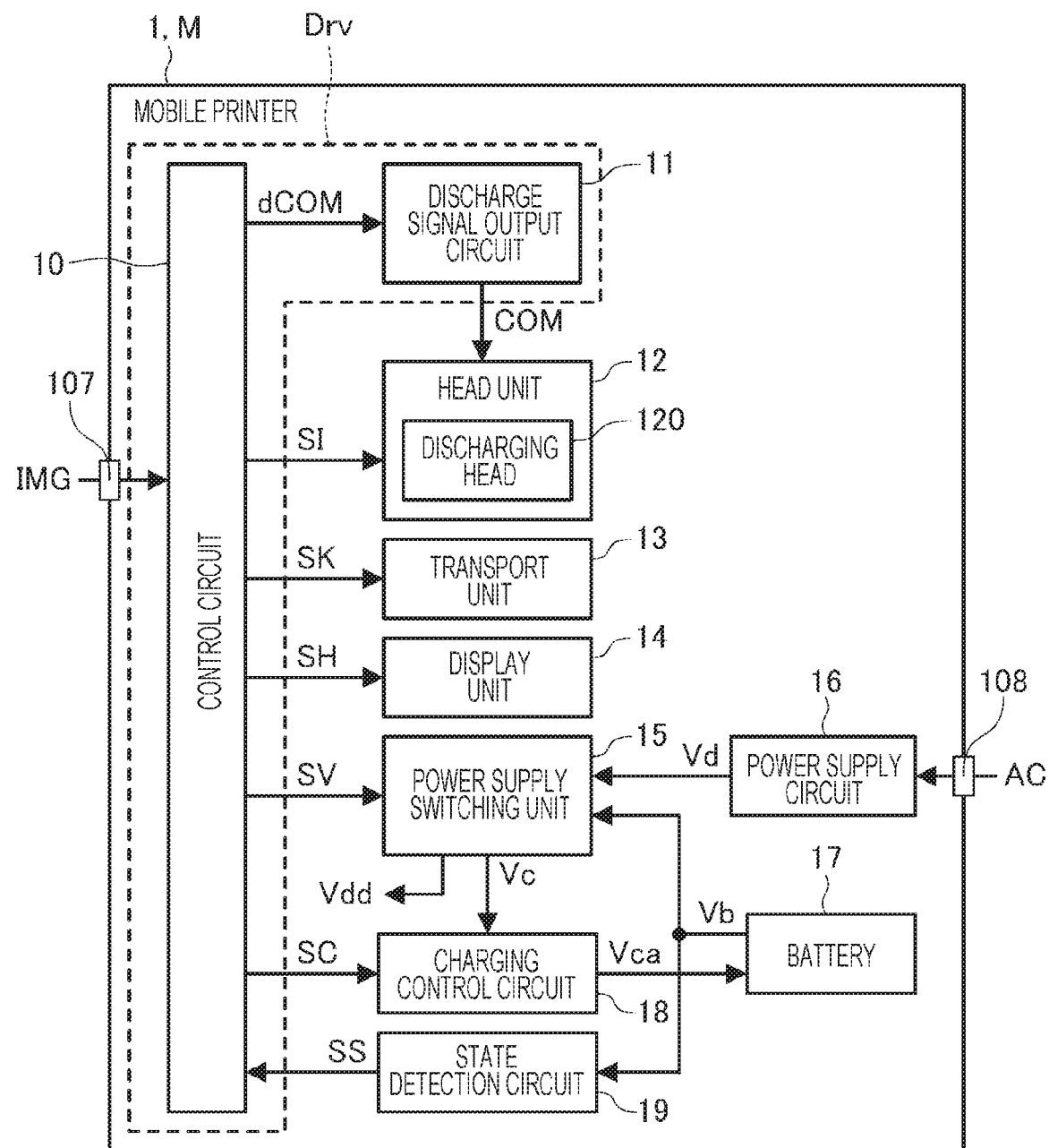
FIG. 1 is a diagram illustrating an example of a functional configuration of a mobile printer.

FIG. 1 is a diagram illustrating an example of a functional configuration of a mobile printer 1 as a mobile device M. As illustrated in FIG. 1, the mobile printer 1 includes a control circuit 10, a discharge signal output circuit 11, a head unit 12, a transport unit 13, a display unit 14, a power supply switching unit 15, a power supply circuit 16, a battery 17, a charging control circuit 18, and a state detection circuit 19.

The control circuit 10 generates a control signal based on an image information signal IMG input from the outside of the mobile printer 1 via a terminal 107, and outputs the control signal to a corresponding component. Thereby, the operations of various components included in the mobile printer 1 are controlled. The control circuit 10 includes, for example, a central processing unit (CPU). The control circuit 10 may include at least one of a digital signal processor (DSP), an application specific integrated circuit (ASIC), a programmable logic device (PLD), and a field programmable gate array (FPGA) instead of or in addition to the CPU.

Specifically, the control circuit 10 generates a waveform defining signal dCOM of a digital signal for defining a waveform of a discharge signal COM output from the discharge signal output circuit 11, and outputs the waveform specification signal to the discharge signal output circuit 11. The discharge signal output circuit 11 generates a discharge signal COM by amplifying an analog signal in class D after converting the input waveform defining signal dCOM into the analog signal. The discharge signal COM generated by the discharge signal output circuit 11 is output to the head unit 12. The waveform defining signal dCOM may be a signal that can define the waveform of the discharge signal COM, and may be an analog signal. Further the discharge signal output circuit 11 may only need to be able to amplify the waveform defined by the waveform defining signal dCOM to a predetermined voltage value and may be configured with a class A amplification circuit, a class B amplification circuit, an AB class amplification circuit, or the like.

Further, the control circuit 10 generates a discharge control signal SI for controlling a discharging of ink from the discharging head 120 included in the head unit 12, and outputs the discharge control signal SI to the head unit 12. Specifically, the discharging head 120 includes a nozzle (not illustrated) and a driving element (not illustrated) for discharging the ink from the nozzle. The driving element drives based on the discharge signal COM input from the discharge signal output circuit 11. Further, the discharging head 120 supplies the discharge signal COM to the driving element at a timing based on the discharge control signal SI input from the control circuit 10. The discharging head 120 discharges the liquid in an amount corresponding to the driving of the driving element from the nozzle. Thereby, a predetermined amount of ink is discharged at a predetermined timing on a medium on which an image is formed. That is, the discharging head 120 discharges the liquid onto the medium based on the discharge signal COM.

Further, the control circuit 10 generates a transport control signal SK for controlling the transport unit 13 and outputs the transport control signal SK to the transport unit 13. The transport unit 13 transports the medium in a predetermined transporting direction in accordance with the input transport control signal SK. The ink is discharged from the discharging head 120 in synchronization with the timing when the transport unit 13 transports the medium based on the transport control signal SK. Thereby, the ink lands on a desired position on the medium and a desired image is formed on the medium.

The control circuit 10 also generates a display control signal SH for controlling a display of various information on the display unit 14, and outputs the display control signal SH to the display unit 14. The display unit 14 displays various information such as operation information and state information of the mobile printer 1 according to the display control signal SH. Thereby, a user is informed of various information including the operation information and the state information of the mobile printer 1.

The control circuit 10 also generates a voltage switching signal SV for controlling a switching of the power supply voltage supplied to the mobile printer 1, and outputs the voltage switching signal SV to the power supply switching unit 15. In addition to the voltage switching signal SV, a voltage Vb output from the battery 17 and a voltage Vd output from the power supply circuit 16 are input to the power supply switching unit 15. Based on the voltage switching signal SV, the power supply switching unit 15 switches between outputting the voltage Vb as the voltage Vdd that is the power supply voltage of the mobile printer 1 and outputting the voltage Vd as the voltage Vdd. The voltage Vdd output from the power supply switching unit 15 is supplied to each component of the mobile printer 1. The power supply switching unit 15 may generate a plurality of voltages Vdd having different voltage values corresponding to the respective components of the mobile printer 1 to which the voltage Vdd is supplied and output the plurality of voltages to the corresponding components.

The power supply switching unit 15 may be configured to compare the voltage values of the voltage Vb output from the battery 17 and the voltage Vd output from the power supply circuit 16, and switch between outputting the voltage Vb as the voltage Vdd that is the power supply voltage of the mobile printer 1 and outputting the voltage Vd as the voltage Vdd according to the comparison result.

Further, based on the voltage switching signal SV, the power supply switching unit 15 switches between outputting the voltage Vb as the voltage Vc that is the charging voltage of the battery 17 and outputting the voltage Vd as the voltage Vc. The voltage Vc output from the power supply switching unit 15 is input to the charging control circuit 18.

Further, the state signal SS indicating the state of the battery 17 is input from the state detection circuit 19 to the control circuit 10. Further, the voltage Vb output from the battery 17 is input to the state detection circuit 19. The state detection circuit 19 estimates the electric charge amount stored in the battery 17 as a state of the battery 17 based on the voltage value of the voltage Vd, and outputs a state signal SS corresponding to the electric charge amount. In addition to the voltage Vd output from the battery 17 described above, a temperature information signal indicating the temperature of the battery 17 may be input to the state detection circuit 19. The state detection circuit 19 may ascertain the temperature of the battery 17 as the state of the battery 17 based on the temperature information signal, and output the state signal SS according to the temperature.

The control circuit 10 also generates a charging control signal SC for controlling whether to charge the battery 17, and outputs the charging control signal SC to the charging control circuit 18. Based on the charging control signal SC, the charging control circuit 18 controls whether to output the voltage Vca, which is based on the voltage Vc output from the power supply switching unit 15, to the battery 17. The control circuit 10 may generate a charging control signal SC for controlling whether to charge the battery 17 according to the state of the battery 17 which is estimated from the state signal SS input from the state detection circuit 19, and output the charging control signal SC to the charging control circuit 18.

An alternating current voltage AC such as a commercial power supply is input to the power supply circuit 16 from the outside of the mobile printer 1. The power supply circuit 16 converts the input alternating current voltage AC into a direct current voltage having a predetermined voltage value, and outputs the direct current voltage to the power supply switching unit 15 as the voltage Vd. That is, the power supply circuit 16 is an AC/DC converter that converts the alternating current voltage AC into a voltage Vd that is a direct current voltage, and is configured with, for example, a flyback circuit or the like.

The battery 17 is a secondary battery that can be charged by the voltage Vca output from the charging control circuit 18, and is specifically a solid-state battery in which an inorganic solid-state substance containing ceramic or the like is used as an electrolyte. The battery 17 generates a voltage Vb corresponding to the electric charge accumulated by the voltage Vca and outputs the voltage Vb to the power supply switching unit 15 and the state detection circuit 19.

In the mobile printer 1 configured as described above, the discharge signal COM is an example of a drive signal, the discharge signal output circuit 11 that outputs the discharge signal COM, or the discharge signal output circuit 11 and the control circuit 10 are included, and the drive unit Dry that outputs the discharge signal COM is an example of a drive signal output circuit. The head unit 12 including the discharging head 120 that discharges the liquid based on the discharge signal COM is an example of a drive portion. Further, the transport unit 13 is driven based on the transport control signal SK, and the display unit 14 is driven based on the display control signal SH. That is, the transport control signal SK and the display control signal SH in the mobile device M drive the transport unit 13 and the display unit 14. The transport control signal SK and the display control signal SH are other examples of the drive signals in the mobile device M, and the transport unit 13, which is driven based on the transport control signal SK, and the display unit 14, which is driven based on the display control signal SH, are other examples of the drive portions in the mobile device M. In the mobile device M, the control circuit 10 that outputs the transport control signal SK and the display control signal SH is another example of the drive signal output circuit. Further, the battery 17 that supplies electric power to the mobile device M including the mobile printer 1, which includes the control circuit 10 and the discharge signal output circuit 11, and that includes an inorganic solid-state substance including ceramic or the like as an electrolyte is an example of a solid-state battery.

1.2 External Appearance of Mobile Printer

Next, the external appearance configuration of the mobile printer 1 as the mobile device M will be described with reference to FIGS. 2 to 4. In the following description, the X axis, the Y axis, and the Z axis that are orthogonal to each other will be used for description. On the X axis, a starting point side of the illustrated arrow may be referred to as "−X side" and a front end side may be referred to as "+X side", a direction from the starting point side toward the front end side along the X axis may be referred to as "+X direction" and a direction from the front end side to the starting point side along the X axis may be referred to as "−X direction", and the "−X direction" and the "+X direction" may be collectively referred to as the "X axis direction". Similarly, on the Y axis, a starting point side of the illustrated arrow may be referred to as "−Y side" and a front end side may be referred to as "+Y side", a direction from the starting point side toward the front end side along the Y axis may be referred to as "+Y direction" and a direction from the front end side to the starting point side along the Y axis may be referred to as "−Y direction", and the "−Y direction" and the "+Y direction" may be collectively referred to as the "Y axis direction". Similarly, on the Z axis, a starting point side of the illustrated arrow may be referred to as "−Z side" and a front end side may be referred to as "+Z side", a direction from the starting point side toward the front end side along the Z axis may be referred to as "+Z direction" and a direction from the front end side to the starting point side along the Z axis may be referred to as "−Z direction", and the "−Z direction" and the "+Z direction" may be collectively referred to as the "Z axis direction". In the following description, the X axis, the Y axis, and the Z axis are described as being orthogonal to each other, but the various components of the mobile device M and the mobile printer 1 are not limited to being orthogonal to each other.

Figure 2:
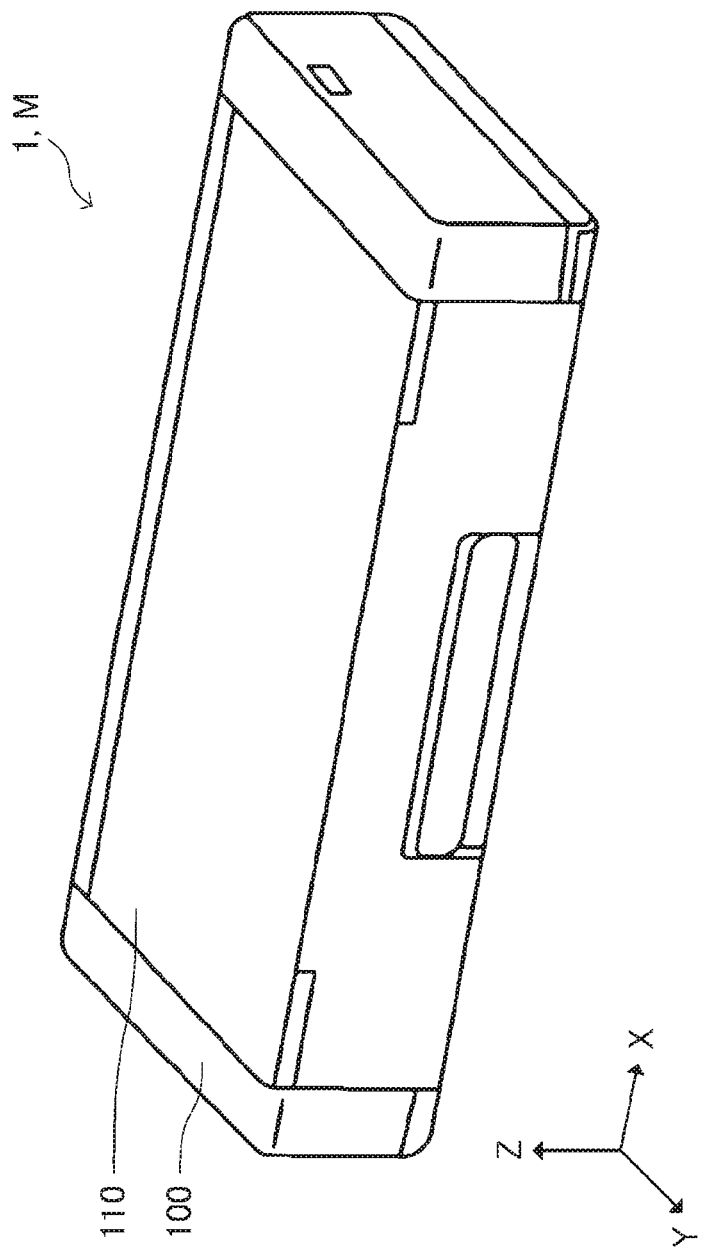
FIG. 2 is a diagram of the mobile printer viewed from a +Y side.

FIG. 2 is a diagram of the mobile printer 1 viewed from the +Y side. FIG. 3 is a diagram of the mobile printer 1 viewed from the +Y side when a cover 110 of the mobile printer 1 is open. FIG. 4 is a diagram of the mobile printer 1 viewed from the −Y side.

As illustrated in FIG. 2, the mobile printer 1 includes a housing 100 and the cover 110 that is positioned on the +Z side of the housing 100 and that can be opened and closed.

Figure 3:
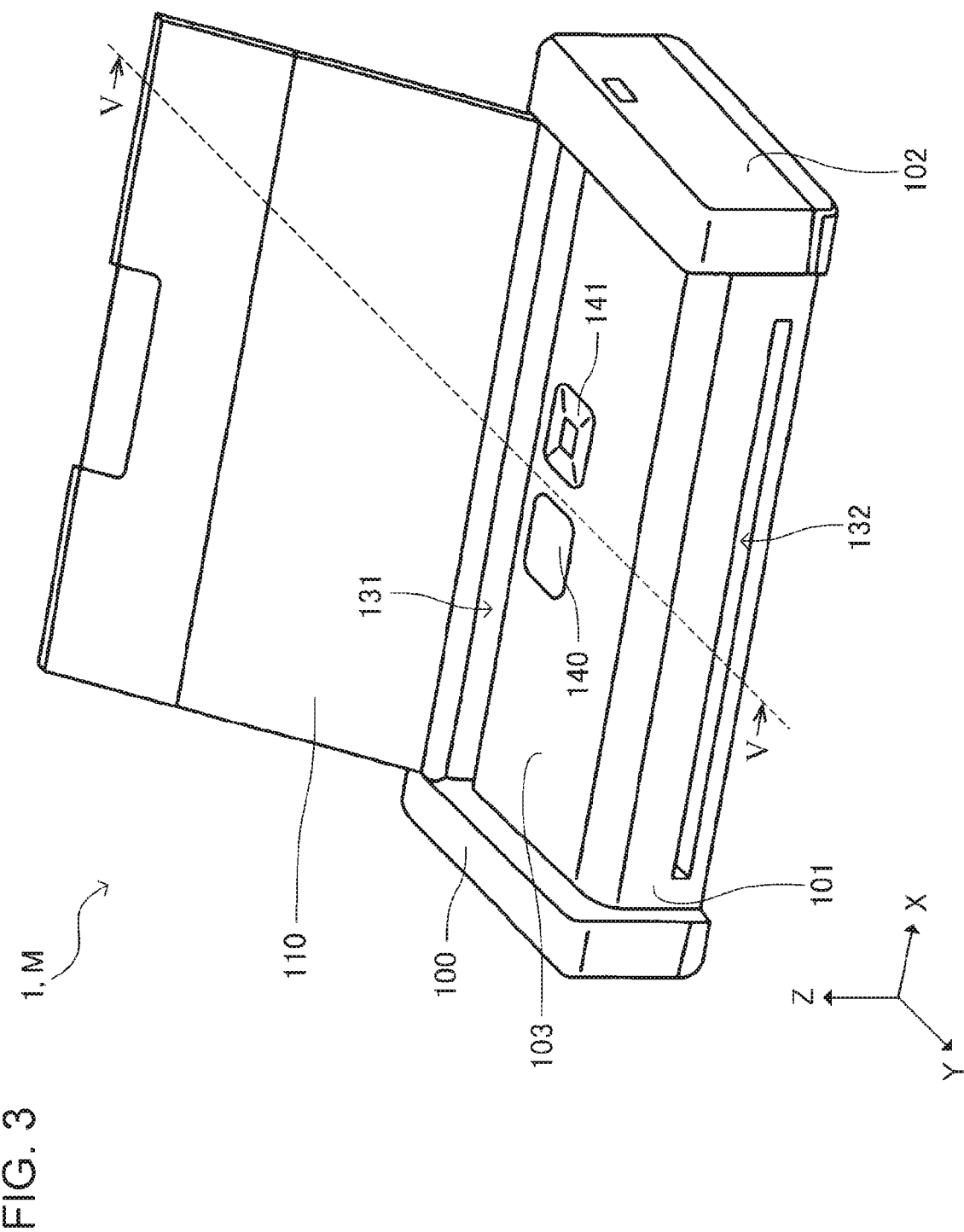
FIG. 3 is a diagram of the mobile printer viewed from the +Y side when a cover of the mobile printer is open.
Figure 4:
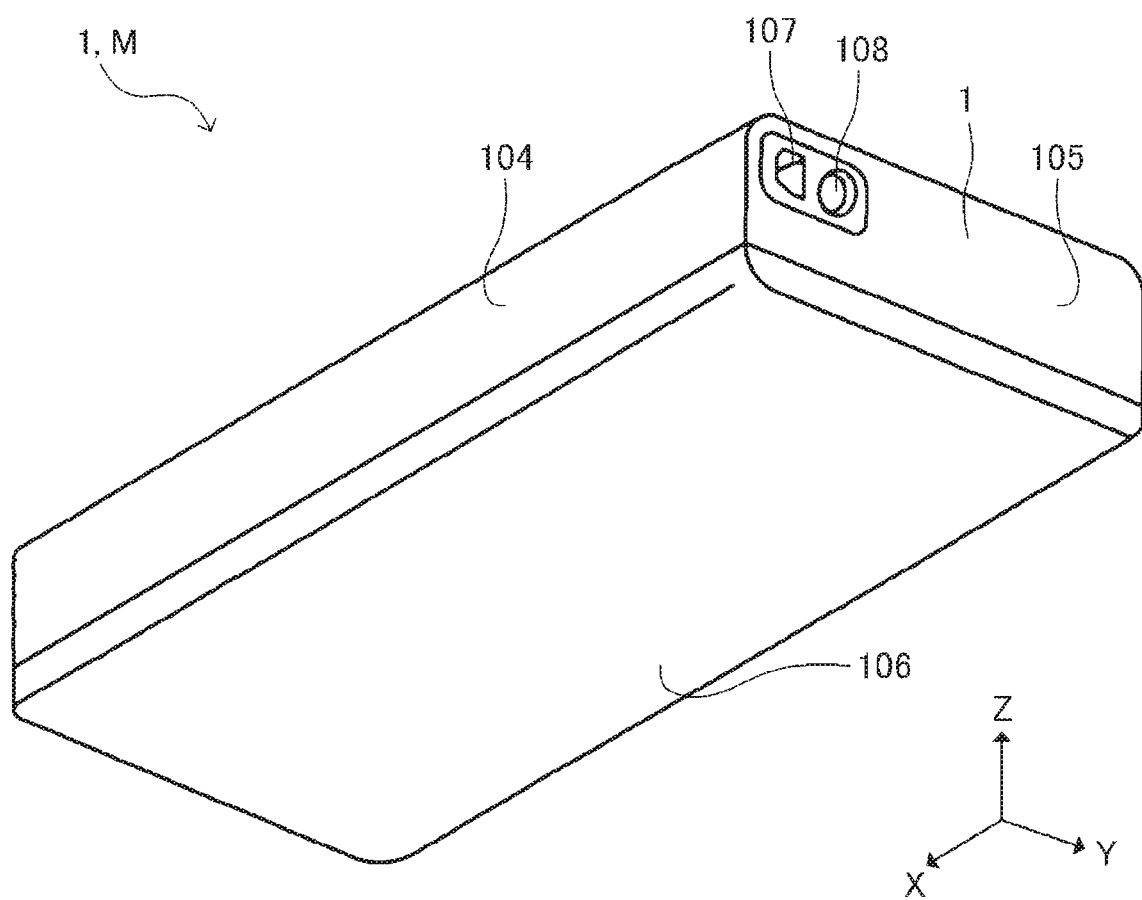
FIG. 4 is a diagram of the mobile printer viewed from a −Y side.

As illustrated in FIGS. 3 and 4, the housing 100 includes wall portions 101 to 106. The wall portion 101 is positioned on the +Y side of the housing 100. The wall portion 102 is positioned on the +X side of the housing 100. The wall portion 103 is positioned on the +Z side of the housing 100. The wall portion 104 is positioned on the −Y side of the housing 100. The wall portion 105 is positioned on the −X side of the housing 100. The wall portion 106 is positioned on the −Z side of the housing 100. That is, the wall portion 101 and the wall portion 104 are positioned to face each other in the direction along the Y axis direction, the wall portion 102 and the wall portion 105 are positioned to face each other in the direction along the X axis direction, and the wall portion 103 and the wall portion 106 are positioned to face each other in the direction along the Z axis direction. In other words, the housing 100 of the mobile printer 1 has a substantially rectangular parallelepiped shape surrounded by the wall portions 101 to 106 and having a space inside.

It is assumed that the mobile printer 1 in the present embodiment is used in a state in which the wall portion 106 is installed such that the wall portion 106 is on the lower side. That is, the wall portion 106 of the housing 100 corresponds to the bottom portion of the mobile printer 1, and the wall portion 103 facing the wall portion 106 in the Z axis direction corresponds to the top portion of the mobile printer 1. The wall portions 101, 102, 104, and 105 of the housing 100 correspond to the side walls of the mobile printer 1. In the following description, the wall portion 106 corresponding to the bottom portion of the mobile printer 1, and the surfaces positioned inside the wall portion 106 and outside the housing 100 may be referred to as the installation surface's of the mobile printer 1.

The display panel 140 and the operation switch 141 are positioned on the wall portion 103 of the housing 100. Based on the display control signal SH, the display panel 140 displays various information based on the operation and state of the mobile printer 1. The display panel 140 is configured to include a display panel such as a liquid crystal panel, an electronic paper panel, or an organic electroluminescence panel. The display panel 140 corresponds to the display unit 14 illustrated in FIG. 1. The operation switch 141 receives various operations by a user. The mobile printer 1 executes various processes based on the operation of the operation switch 141. The wall portion 103 may be provided with a touch panel in which the display panel 140 and the operation switch 141 are integrated. In this case, the touch panel in which the display panel 140 and the operation switch 141 are integrated corresponds to the display unit 14 illustrated in FIG. 1.

A supply port 131 for supplying a medium to the housing 100 of the mobile printer 1 is provided on the −Y side of the wall portion 103. Further, the wall portion 101 is provided with an exhaust port 132 that exhausts the medium from the housing 100. The medium supplied from the supply port 131 to the inside of the housing 100 is transported toward the exhaust port 132 by the transport unit 13 illustrated in FIG. 1. Thereafter, the ink is discharged from the head unit 12 accommodated inside the housing 100 in synchronization with the timing when the medium is transported. Thereby, the medium is exhausted from the exhaust port 132 in a state where the desired image is formed.

Further, as illustrated in FIG. 4, the wall portion 105 is provided with a terminal 107 to which the image information signal IMG is input and a terminal 108 to which the alternating current voltage AC is supplied. The terminal 107 is, for example, a universal serial bus (USB) port to which a USB cable for communicatively connecting to an external apparatus such as a personal computer or a digital camera is connected, and the terminal 108 is, for example, an inlet socket to which the alternating current voltage AC that is a commercial power supply is input.

The terminal 107 is not limited to the USB port, and may be a printer port, for example. Further, the image information signal IMG may be supplied to the mobile printer 1 via wireless communication. In this case, the mobile printer 1 may not include the terminal 107. Further, the terminal 108 is not limited to the inlet socket to which the alternating current voltage AC is input, and may be, for example, a DC plug to which an AC adapter provided outside is connected. In this case, the voltage Vd obtained by converting the alternating current voltage AC into a direct current voltage by the AC adapter is input to the terminal 108. Therefore, when the mobile printer 1 has a DC plug, the mobile printer 1 may be configured without including the power supply circuit 16.

1.3 Battery Disposition for Mobile Printer

As described above, the mobile printer 1 includes the drive unit Dry including the control circuit 10 that is an example of the drive signal output circuit and the discharge signal output circuit 11, the head unit 12 that is an example of the above-described drive portion, the battery 17 that is an example of a solid-state battery, the drive unit Dry included in the mobile printer 1, the head unit 12, and the housing 100 that accommodates the battery 17.

Because of the portability, the mobile device including such a mobile printer is highly likely to be shocked due to a dropping, or the like as compared with the stationary type printer of device, and when a shock such as a dropping is applied to the mobile device, an abnormality may occur in a circuit provided inside the mobile device or a battery that supplies an electric power to the circuit. When an abnormality occurs in a circuit or a battery included in the mobile device, there is a possibility that an abnormality occurs in the operation of the mobile device.

For such a problem that the abnormality in the operation of the mobile device M may occur due to such a shock, in the mobile printer 1 and the mobile device M of the present embodiment, the shock which is applied to the circuits included in the mobile printer 1 and the mobile device M is alleviated by the battery 17. As described above, the battery 17 in the present embodiment is a solid-state battery with a solid electrolyte. Since the solid-state battery has a solid electrolyte, even when the solid-state battery is damaged due to a shock, the electrolyte is unlikely to leak to the outside. In other words, the resistance with respect to a shock of the battery 17 is higher than that of a liquid battery such as a lithium ion battery in the related art. Therefore, even when a shock is applied to the battery 17 that is a solid-state battery, the battery 17 can output the voltage Vb having a normal value.

In the mobile printer 1 and the mobile device M according to the present embodiment, the shock applied to the drive unit Dry is alleviated by using the battery 17 including the solid-state battery having high resistance with respect to such a shock. Thereby, the battery 17 can output the voltage Vb having a normal value, and further, the drive unit Dry can output the discharge signal COM and the discharge control signal SI having normal values. As a result, various components including the head unit 12 that operates based on the discharge signal COM and the discharge control signal SI can operate normally. In other words, the possibility that an abnormality will occur in various components including the head unit 12 is reduced.

As described above, in the mobile device M including the mobile printer 1 according to the present embodiment, even when a shock due to a dropping or the like is applied, by alleviating the shock, it is possible to reduce the possibility that an abnormality occurs in the drive unit Dry and the battery 17 that supplies electric power to the drive unit Dry. Therefore, the possibility that an abnormality occurs in the operation of the mobile device M is reduced.

Therefore, in the mobile device M including the mobile printer 1, a specific example of the disposition of the battery 17 for alleviating the shock applied to the drive unit Dry will be described with reference to FIGS. 5 to 7. As described above, the housing 100 includes the wall portions 101 to 106. In the following description, the surface of the wall portion 101 positioned inside the housing 100 is referred to as an inner surface 101a, and the surface of the wall portion 101 positioned outside the housing 100 is referred to as an outer surface 101b. Similarly, the respective surfaces of the wall portions 102 to 106 positioned inside the housing 100 are referred to as inner surfaces 102a to 106a, and the respective surfaces of the wall portions 102 to 106 positioned outside the housing 100 are referred to as outer surfaces 102b to 106b.

Figure 5:
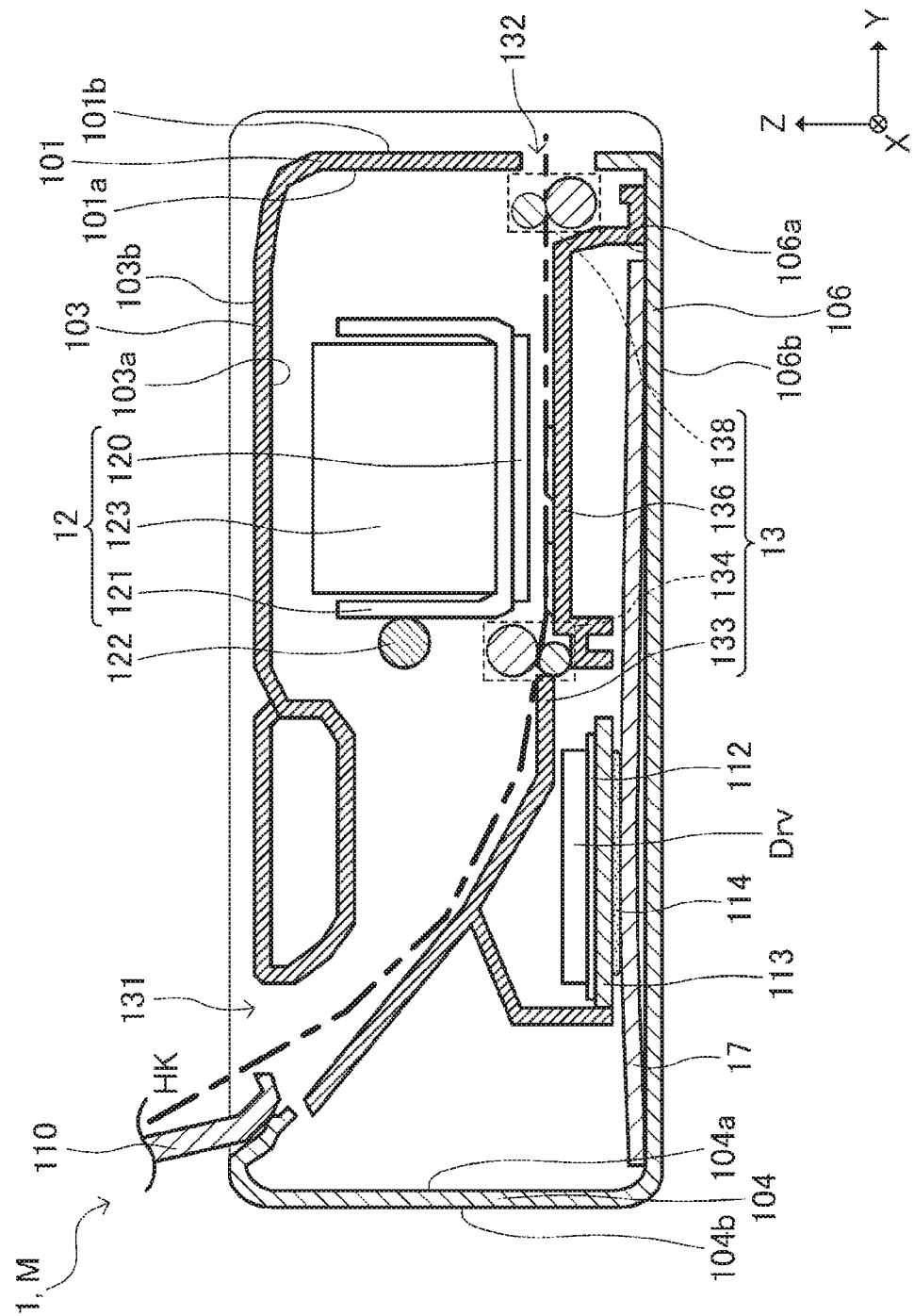
FIG. 5 is a diagram illustrating a cross-sectional structure of the mobile printer when the mobile printer is cut along the line V-V illustrated in FIG. 3.

FIG. 5 is a diagram illustrating a cross-sectional structure of the mobile printer 1 when the mobile printer 1 is cut along the line V-V illustrated in FIG. 3. In FIG. 5, the carriage 121 included in the head unit 12 that is provided in the mobile printer 1 reciprocates along the X axis direction and a so-called serial type ink jet printer that forms an image on a medium by discharging the ink from the discharging head 120 attached to the carriage 121 will be described as an example.

As illustrated in FIG. 5, the mobile printer 1 includes a head unit 12, a transport unit 13, a circuit substrate 112, and a battery 17.

The head unit 12 includes a discharging head 120, a carriage 121, and a liquid storage portion 123. The carriage 121 is supported by a carriage guide shaft 122 on the −Y side so as to be capable of reciprocating. The carriage 121 reciprocates in the direction along the X axis direction in a state of being supported by the carriage guide shaft 122.

The discharging head 120 is attached to the −Z side of the carriage 121. Further, the liquid storage portion 123 that stores the ink discharged from the discharging head 120 is mounted on the +Z side of the carriage 121. The liquid storage portion 123 and the discharging head 120 are connected by a liquid flow path (not illustrated). That is, the ink stored in the liquid storage portion 123 is supplied to the discharging head 120 via the liquid flow path (not illustrated). The discharging head 120 discharges the supplied ink based on the discharge signal COM and the discharge control signal SI.

The transport unit 13 includes a medium supporting portion 133, a pair of transporting rollers 134, a medium supporting portion 136, and a pair of transporting rollers 138. The medium supporting portions 133 and 136 form a transport path HK for transporting the medium supplied from the supply port 131 to the exhaust port 132. That is, the transport unit 13 transports the medium from the supply port 131 toward the exhaust port 132. The transport unit 13 is an example of a transport portion.

Specifically, the medium supplied from the supply port 131 is transported from the medium supporting portion 133 to the medium supporting portion 136 with the driving of the pair of transporting rollers 134. The medium supporting portion 136 is positioned on the −Z side of the discharging head 120 attached to the carriage 121. In other words, the medium supporting portion 136 is positioned so as to face the discharging head 120 attached to the carriage 121 in the Z axis direction. Thereafter, the ink is discharged from the discharging head 120 in a state where the medium transported along the transport path HK is supported by the medium supporting portion 136. Thereby, the ink lands on the medium and an image is formed on the medium.

That is, the discharging head 120 discharges the ink onto the medium transported on the −Z side of the discharging head 120. In other words, the discharging head 120 discharges the ink along the −Z direction. The −Z direction, which is the direction in which the ink is discharged from the discharging head 120, is an example of the discharging direction. Thereafter, the medium on which the ink is landed is transported to the exhaust port 132 with the driving of the pair of transporting rollers 138.

Further, the mobile printer 1 includes pairs of transporting rollers 134 and 138, and a driving motor (not illustrated) for driving the carriage 121. The control circuit 10 controls the driving of the pairs of transporting rollers 134 and 138 and the carriage 121 by controlling the driving motor (not illustrated) by the transport control signal SK. Thereby, the transport of the medium along the transport path HK and the movement of the carriage 121 to which the discharging head 120 is attached are controlled. As a result, it becomes possible to discharge a predetermined amount of ink to a desired position on the medium, and a desired image is formed on the medium.

Further, a circuit substrate 112 and a substrate supporting portion 113 are provided on the −Z side of the transport path HK. That is, the substrate supporting portion 113 is also accommodated in the housing 100 which is included in the mobile printer 1. Various circuits constituting the drive unit Dry are mounted on the +Z side of the circuit substrate 112. In addition to the drive unit Dry, the charging control circuit 18 and the state detection circuit 19 illustrated in FIG. 1 may be mounted on the circuit substrate 112.

The circuit substrate 112 is attached to a substrate supporting portion 113 provided on the −Z side of the circuit substrate 112. In other words, the substrate supporting portion 113 supports the circuit substrate 112 and the drive unit Dry mounted on the circuit substrate 112. The substrate supporting portion 113 supports the circuit substrate 112 by fixing the circuit substrate 112 with a screw or the like. In this case, the circuit substrate 112 and the substrate supporting portion 113 are desirably fixed so as not to make electrical contact therebetween with each other, for example, the circuit substrate 112 may be fixed to the substrate supporting portion 113 in a state where an insulating member (not illustrated) interposed between the circuit substrate 112 and the substrate supporting portion 113, or the circuit substrate 112 may be fixed to the substrate supporting portion 113 by using a spacer or the like for forming a space between the circuit substrate 112 and the substrate supporting portion 113. The substrate supporting portion 113 that supports the circuit substrate 112 is an example of a supporting portion.

The battery 17 is positioned on the −Z side of the substrate supporting portion 113. Further, the wall portion 106 of the housing 100 is positioned on the −Z side of the battery 17. That is, the battery 17 is provided between the wall portion 106 of the housing 100 and the substrate supporting portion 113, the battery 17 is positioned between the outer surface 106b of the wall portion 106 of the housing 100 and the substrate supporting portion 113, and the substrate supporting portion 113 is positioned between the drive unit Dry mounted on the circuit substrate 112 and the battery 17.

The substrate supporting portion 113 and the battery 17 are fixed by a fixing member 114. In other words, the mobile printer 1 includes the fixing member 114 that fixes the battery 17. The fixing member 114 only needs to be able to fix the battery 17 to the substrate supporting portion 113, and for example, an adhesive agent, a tape, a screw or the like is used.

The fixing member 114 may be provided so as to fix the entire surface of the battery 17 to the substrate supporting portion 113, but as illustrated in FIG. 5, is desirably provided so as to fix only a part of the battery 17 to the substrate supporting portion 113. In other words, it is desirable that at least a part of the battery 17 is not fixed to the substrate supporting portion 113. Since at least a part of the battery 17 is not fixed to the substrate supporting portion 113, a part of the battery 17 can be deformed when a shock is applied to the mobile printer 1. Further, by deforming a part of the battery 17, the shock applied to the mobile printer 1 can be alleviated. As a result, the shock applied to the circuit substrate 112 can be alleviated, and the shock applied to the drive unit Dry mounted on the circuit substrate 112 is also alleviated.

The battery 17 is positioned in the vicinity of the wall portion 106 that is the bottom portion of the mobile printer 1. The details of the disposition and shape of the battery 17 positioned in the vicinity of the wall portion 106 will be described with reference to FIGS. 5, 6, and 7. FIG. 6 is a diagram for explaining the disposition of the battery 17 when the mobile printer 1 is viewed from the +Y side. FIG. 7 is a diagram for explaining the disposition of the battery 17 when the mobile printer 1 is viewed from the +Z side.

Figure 6:
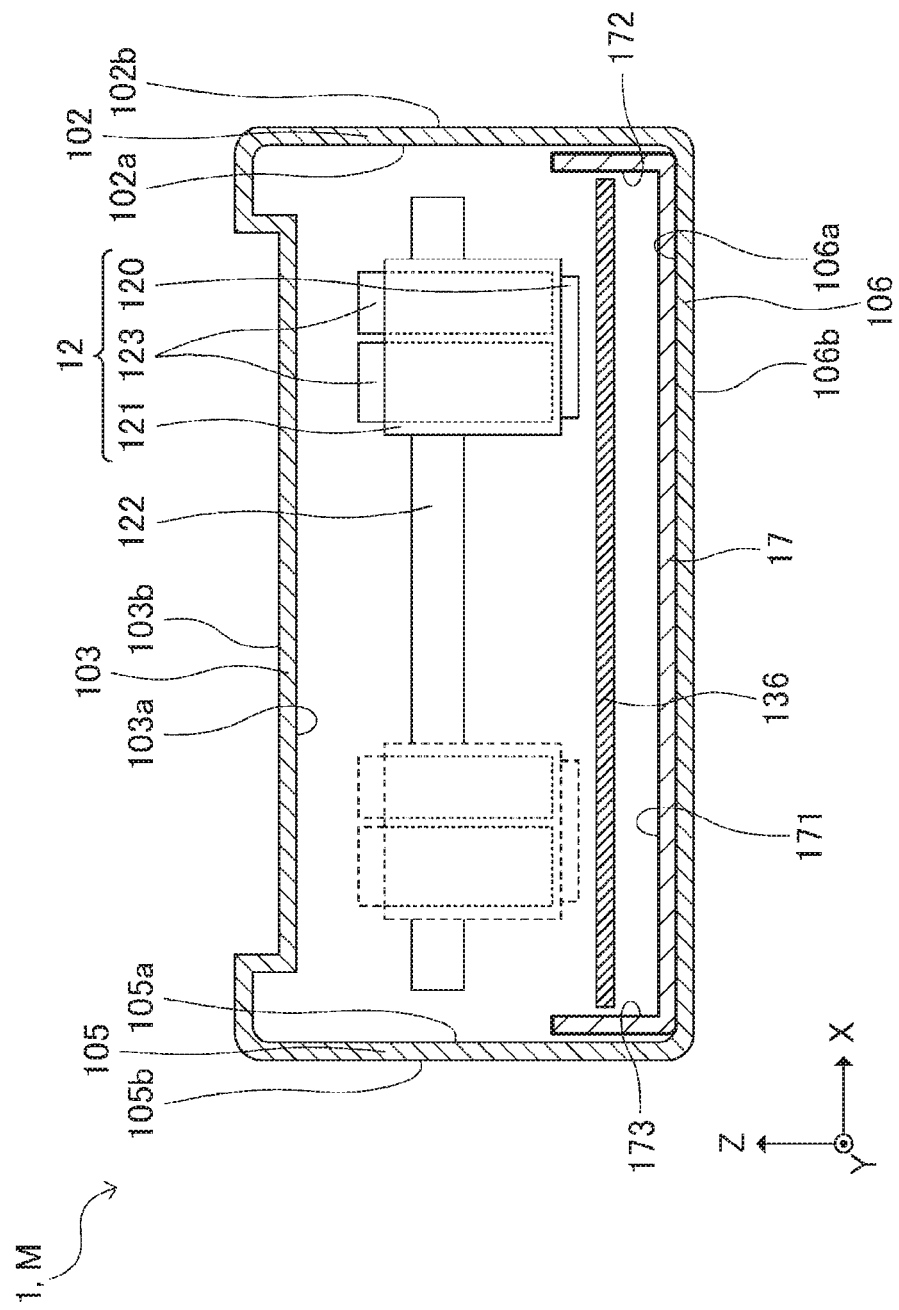
FIG. 6 is a diagram for explaining a disposition of a battery when the mobile printer is viewed from the +Y side.
Figure 7:
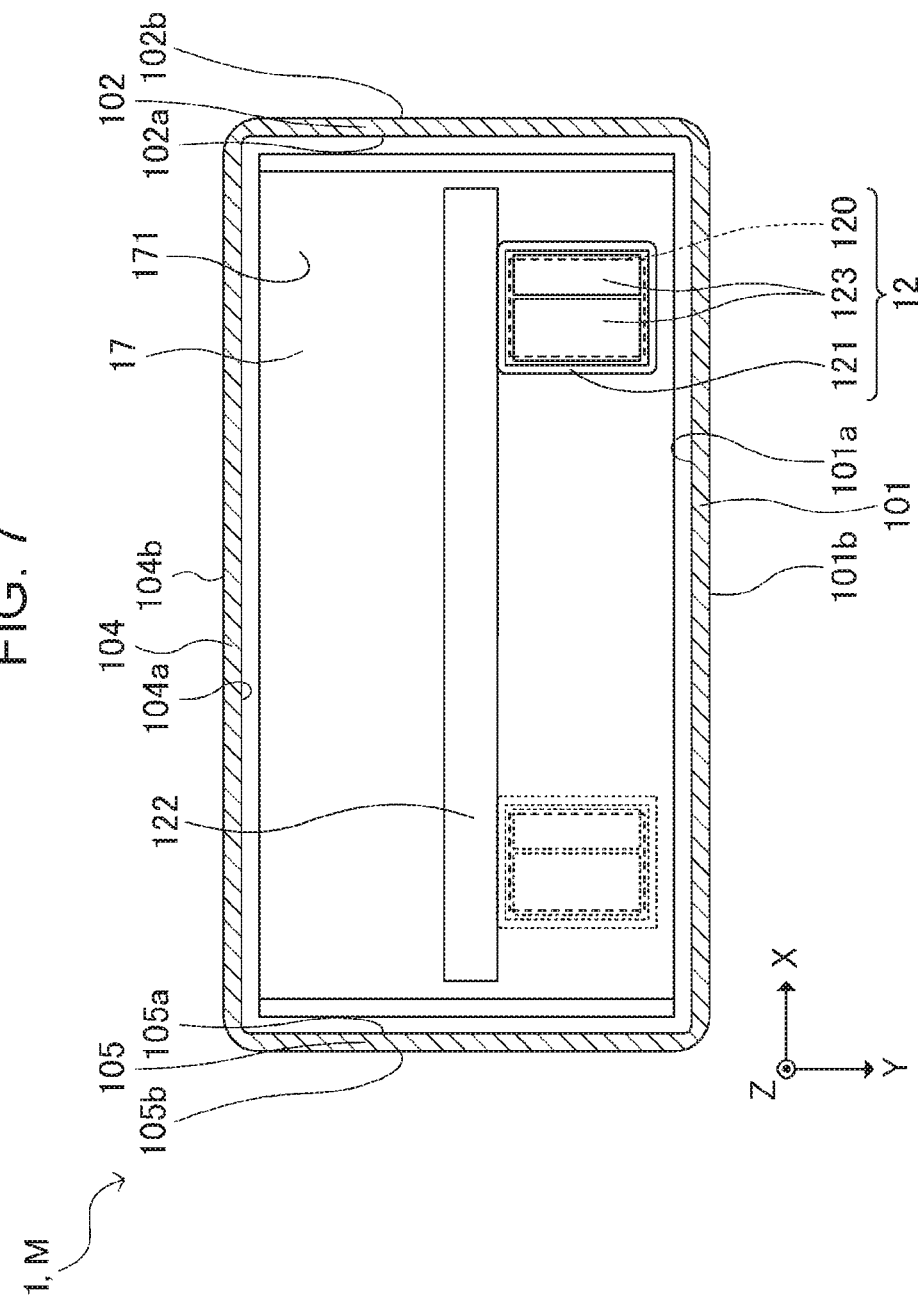
FIG. 7 is a diagram for explaining a disposition of the battery when the mobile printer is viewed from a +Z side.

As illustrated in FIGS. 6 and 7, the battery 17 includes a surface 171, a surface 172 which is connected to the surface 171, and a surface 173 which is connected to the surface 171 and facing the surface 172 along the X axis direction. The surfaces 171, 172, and 173 which are included in the battery 17 may be formed by bending one battery 17 having a plate shape.

The surface 171 extends in a direction in which the wall portion 106 of the housing 100 extends, that is, in a direction in which the outer surface 106b extends. In other words, the battery 17 extends along the installation surface on which the mobile printer 1 is installed.

When the mobile printer 1 is installed for use, a shock due to the installation is applied to the wall portion 106 that is also an installation surface of the mobile printer 1. In the mobile printer 1 according to the present embodiment, as illustrated in FIGS. 6 and 7, the battery 17 has a surface 171 extending along the outer surface 106b, thereby the shock generated when the mobile printer 1 is installed is alleviated by the battery 17. That is, the shock applied to the drive unit Dry by the battery 17 is alleviated. Therefore, the possibility that an abnormality occurs in the drive unit Dry due to the shock is reduced, and as a result, the possibility that an abnormality occurs in the operation of the mobile printer 1 including the drive unit Dry is also reduced. The surface 171 of the battery 17 extending along the outer surface 106b is an example of a first battery surface.

The surface 172 is connected to the surface 171, and extends along the direction in which the wall portion 102 of the housing 100 extends and the direction in which the outer surface 102b extends. That is, at least one of the surface 171 and the surface 172 of the battery 17 is positioned between a contact point where the wall portion 106 and the wall portion 102 are connected to each other and a contact point where the outer surface 106b and the outer surface 102b are connected to each other, and the substrate supporting portion 113. In other words, the battery 17 is positioned between the contact point where the wall portion 106 and the wall portion 102 are connected to each other and the contact point where the outer surface 106b and the outer surface 102b are connected to each other, and the substrate supporting portion 113.

When the mobile device M including the mobile printer 1 is dropped, the corner portion of the mobile device M is likely to come into contact with the ground or the like before the wall portions 101 to 106. Therefore, in the mobile device M including the mobile printer 1, the shock is more likely to be applied to the corner portion of the housing 100 as compared with the wall portions 101 to 106. With respect to such a shock applied to the corner portion of the housing 100, by positioning the battery 17 between the contact point where the outer surface 106b and the outer surface 102b are connected to each other, and the substrate supporting portion 113, the shock applied to the contact point where the outer surface 106b and the outer surface 102b are connected to each other, can be alleviated by the battery 17. That is, even when a shock is applied to the corner portion of the housing 100, the shock applied to the circuit substrate 112 is alleviated by the battery 17. As a result, the possibility that an abnormality occurs in the drive unit Dry is further reduced, and the possibility that an abnormality occurs in the operation of the mobile device M including the drive unit Drv is further reduced. The surface 172 of the battery 17 extending along the outer surface 102b is an example of a second battery surface.

The surface 173 is connected to the surface 171, and extends along the direction in which the wall portion 105 of the housing 100 extends and the direction in which the outer surface 105b extends. That is, at least one of the surface 171 and the surface 173 of the battery 17 is positioned between a contact point where the wall portion 106 and the wall portion 105 are connected to each other and a contact point where the outer surface 106b and the outer surface 105b are connected to each other, and the substrate supporting portion 113. In other words, the battery 17 is positioned between the contact point where the wall portion 106 and the wall portion 105 are connected to each other and the contact point where the outer surface 106b and the outer surface 105b are connected to each other, and the substrate supporting portion 113.

When the mobile device M including the mobile printer 1 is dropped, the corner portion of the mobile device M is likely to come into contact with the ground or the like before the wall portions 101 to 106. Therefore, in the mobile device M including the mobile printer 1, the shock is more likely to be applied to the corner portion of the housing 100 as compared with the wall portions 101 to 106. With respect to such a shock applied to the corner portion of the housing 100, by positioning the battery 17 between the contact point where the outer surface 106b and the outer surface 105b are connected to each other and the substrate supporting portion 113, the shock applied to the contact point where the outer surface 106b and the outer surface 105b are connected to each other, can be alleviated by the battery 17. That is, even when a shock is applied to the corner portion of the housing 100, the shock applied to the circuit substrate 112 is alleviated by the battery 17. As a result, the possibility that an abnormality occurs in the drive unit Drv is further reduced, and the possibility that an abnormality occurs in the operation of the mobile device M including the drive unit Drv is further reduced. The surface 173 of the battery 17 extending along the outer surface 105b is another example of the second battery surface.

Further, the surfaces 172 and 173 of the battery 17 according to the present embodiment are side surfaces of the housing 100, and extend along the wall portions 102 and 105, where the supply port 131 that supplies the medium and the exhaust port 132 in which the medium is exhausted, are not provided. Thereby, the surfaces 172 and 173 of the battery 17 provided along the side surface of the housing 100 do not hinder the transport of the medium in the mobile printer 1. That is, in the mobile printer 1 according to the present embodiment, it is possible to alleviate the shock applied to the circuit substrate 112 accommodated in the housing 100 without hindering the transport of the medium in the mobile printer 1.

The wall portion 106 of the housing 100 included in the mobile printer 1 intersects the −Z direction, which is a direction in which the ink is discharged from the discharging head 120. That is, the outer surface 106b, which is a surface of the outside of the wall portion 106, intersects the −Z direction, which is a direction in which the ink is discharged from the discharging head 120. The outer surface 106b is an example of a first housing surface. At least one of the outer surface 102b, which is a surface of the outside of the wall portion 102 connected to the wall portion 106, and the outer surface 105b, which is a surface of the outside of the wall portion 105 connected to the wall portion 106, is an example of a second housing surface. Further, in the housing 100, the supply port 131 is provided, the outer surface 103b of the wall portion 103 which is different from the outer surface 106b, the outer surface 102b, and the outer surface 105b is an example of a third housing surface, an exhaust port 132 is provided, and the outer surface 101b of the wall portion 101 which is different from the outer surface 106b, the outer surface 102b, and the outer surface 105b is an example of a fourth housing surface.

1.4 Operational Effects

As described above, the mobile printer 1 as the mobile device M in the first embodiment includes a discharging head 120 that discharges the ink onto the medium based on the discharge signal COM and the discharge control signal SI, a battery 17 that is a solid-state battery that supplies the electric power to the drive unit Drv that outputs the discharge signal COM and the discharge control signal SI, and a substrate supporting portion 113 that supports the drive unit Drv. Further, in the mobile printer 1, the battery 17 is positioned between the outer surface 106b included in the wall portion 106 that intersects the −Z direction, which is the direction in which the ink is discharged from the discharging head 120, and the substrate supporting portion 113 that supports the circuit substrate 112 on which the drive unit Drv is mounted.

Since the battery 17 is a solid-state battery in which the electrolyte is solid, the battery 17 has large resistance with respect to a shock, and further, by providing the battery 17 having a large resistance with respect to a shock between the outer surface 106b included in the wall portion 106 to which a shock may be applied and the substrate supporting portion 113, the shock applied to the circuit substrate 112 on which the drive unit Drv supported by the substrate supporting portion 113 is mounted is alleviated. Thereby, the possibility that an abnormality occurs in the battery 17 and the circuit substrate 112 on which the drive unit Drv is mounted is reduced, and as a result, the possibility that an abnormality occurs in the operation of the mobile printer 1 as the mobile device M due to a shock is reduced. That is, it is possible to reduce the influence of shock with respect to the mobile device M including the mobile printer 1 having portability.

1.5 Modification Example

In the mobile printer 1 as the mobile device M of the first embodiment, although the carriage 121 performs a reciprocal movement along the X axis direction inside the housing 100 and the serial type ink jet printer that discharges the liquid from the discharging head 120 at the timing synchronized with the reciprocal movement has been described as an example, a so-called line type ink jet printer may be provided in which a plurality of discharging heads 120 are provided side by side in a direction intersecting the medium transporting direction, and liquid is discharged from each of the plurality of discharging heads 120 as the medium is transported. Even with the mobile device M including the mobile printer 1 having such a configuration, the same operational effects as the mobile device M of the first embodiment described above can be obtained.

Further, in the mobile printer 1 as the mobile device M according to the first embodiment, although the description has been made assuming that the liquid storage portion 123 that stores the liquid is mounted in the carriage 121 inside the housing 100, the liquid storage portion 123 may not be mounted on the carriage and may be configured to be installed at a predetermined position inside the housing 100. Even with the mobile device M including the mobile printer 1 having such a configuration, the same operational effects as the mobile device M of the first embodiment described above can be obtained.

2. Second Embodiment

Next, as a mobile device of a second embodiment, a smartphone that is a display apparatus that displays various kinds of information on a display panel and can be operated by a battery will be described as an example.

2.1 Functional Configuration of Smartphone

Figure 8:
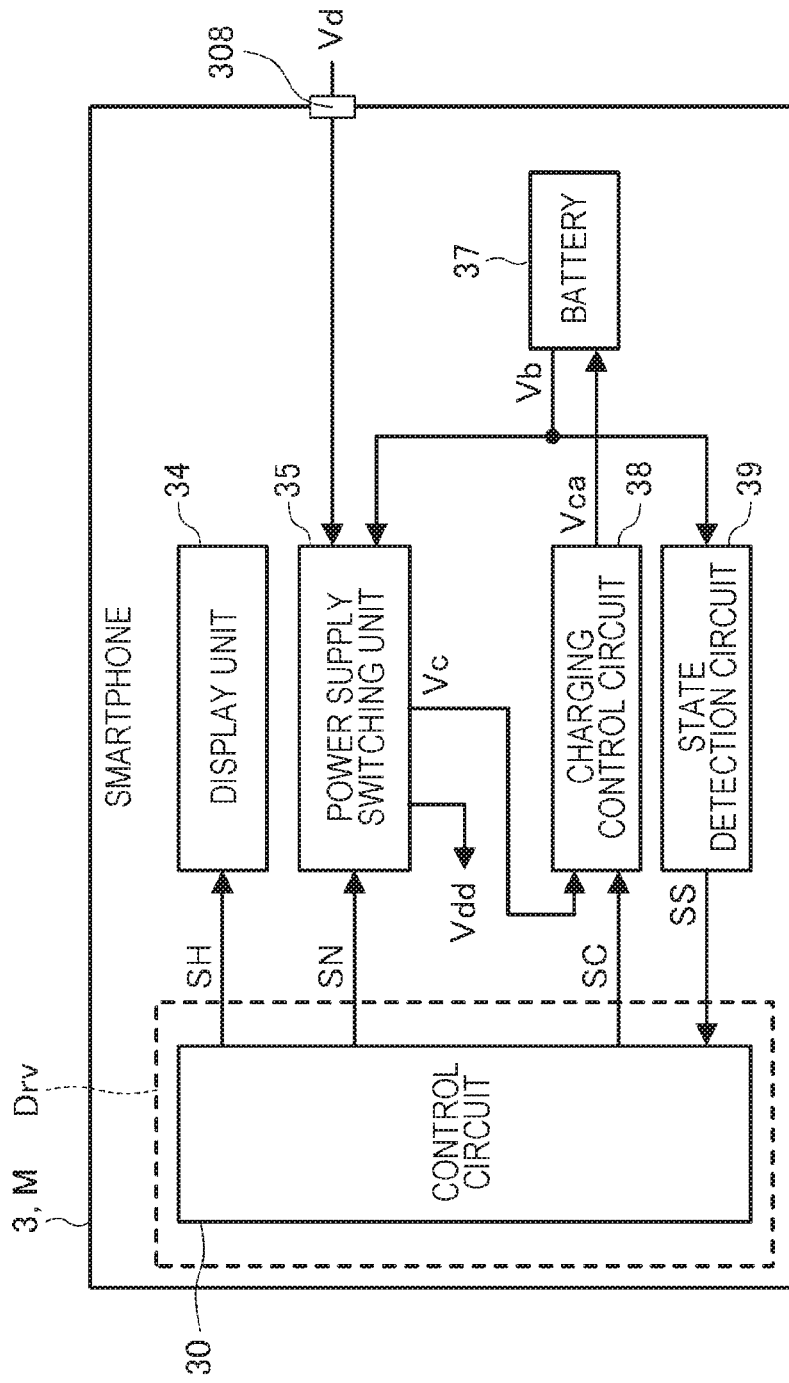
FIG. 8 is a diagram illustrating an example of a functional configuration of a smartphone.

FIG. 8: is a diagram illustrating an example of a function configuration of a smartphone 3 as the mobile device M of the second embodiment. As illustrated in FIG. 8, the smartphone 3 includes a control circuit 30, a display unit 34, a power supply switching unit 35, a battery 37, a charging control circuit 38, and a state detection circuit 39.

The control circuit 30 generates a control signal based on the information input from the outside, and outputs the control signal to a corresponding component. Thereby, the control circuit 30 controls an operation of various components included in the smartphone 3. The control circuit 30 is configured to include, for example, a central processing unit (CPU). The control circuit 30 may be configured to include at least one of a digital signal processor (DSP), an application specific integrated circuit (ASIC), a programmable logic device (PLD), and a field programmable gate array (FPGA) instead of or in addition to the CPU.

Specifically, the control circuit 30 also generates a display control signal SH for controlling a display of various information on the display unit 34, and outputs the display control signal SH to the display unit 34. Thereafter, the display unit 34 displays various information of the smartphone 3 according to the display control signal SH. Thereby, a user is notified of the operation information of the smartphone 3 and various information acquired by the smartphone 3. The information acquired by the smartphone 3 includes, for example, information such as acquisition information acquired by the smartphone 3 via a network line such as the Internet, terminal information such as the usage history of the smartphone 3, or state information indicating the remaining battery level of the smartphone 3 or the reception radio wave condition.

The control circuit 30 also generates a voltage switching signal SV for controlling a switching of the power supply voltage supplied to the smartphone 3, and outputs the voltage switching signal SV to the power supply switching unit 35. In addition to the voltage switching signal SV, a voltage Vb output from the battery 37 and a voltage Vd input from the outside of the smartphone 3 via the terminal 308 are input to the power supply switching unit 35. Based on the voltage switching signal SV, the power supply switching unit 35 switches between outputting the voltage Vb as the voltage Vdd that is the power supply voltage of the smartphone 3 and outputting the voltage Vd as the voltage Vdd. The voltage Vdd output from the power supply switching unit 35 is supplied to each component of the smartphone 3. The power supply switching unit 35 may generate a plurality of voltages Vdd having different voltage values corresponding to the respective components of the smartphone 3 to which the voltage Vdd is supplied and output the plurality of voltages to the corresponding components.

The power supply switching unit 35 may be configured to compare the voltage values of the voltage Vb output from the battery 37 and the voltage Vd input via the terminal 308, and switch between outputting the voltage Vb as the voltage Vdd that is the power supply voltage of the smartphone 3 and outputting the voltage Vd as the voltage Vdd according to the comparison result.

Further, based on the voltage switching signal SV, the power supply switching unit 35 switches between outputting the voltage Vb as the voltage Vc that is the charging voltage of the battery 37 and outputting the voltage Vd as the voltage Vc. The voltage Vc output from the power supply switching unit 35 is input to the charging control circuit 38.

Further, the state signal SS indicating the state of the battery 37 is input from the state detection circuit 39 to the control circuit 30. Further, the voltage Vb output from the battery 37 is input to the state detection circuit 39. The state detection circuit 39 estimates the electric charge amount stored in the battery 37 as a state of the battery 37 based on the voltage value of the voltage Vd, and outputs a state signal SS corresponding to the electric charge amount. In addition to the voltage Vd output from the battery 37 described above, a temperature information signal indicating the temperature of the battery 37 may be input to the state detection circuit 39. The state detection circuit 39 may ascertain the temperature of the battery 37 as the state of the battery 37 based on the temperature information signal, and output the state signal SS according to the temperature.

The control circuit 30 also generates a charging control signal SC for controlling whether to charge the battery 37, and outputs the charging control signal SC to the charging control circuit 38. Based on the charging control signal SC, the charging control circuit 38 controls whether to output the voltage Vca, which is based on the voltage Vc output from the power supply switching unit 35, to the battery 37. The control circuit 30 may generate a charging control signal SC for controlling whether to charge the battery 37 according to the state of the battery 37 which is estimated from the state signal SS input from the state detection circuit 39, and output the charging control signal SC to the charging control circuit 38.

The battery 37 is a secondary battery that can be charged by the voltage Vca output from the charging control circuit 38, and is specifically a solid-state battery in which an inorganic solid-state substance containing ceramic or the like is used as an electrolyte. The battery 37 generates a voltage Vb corresponding to the electric charge accumulated by the voltage Vca and outputs the voltage Vb to the power supply switching unit 35 and the state detection circuit 39.

In the mobile device M of the second embodiment including the smartphone 3 configured as described above, the display unit 34 is driven based on the display control signal SH output from the control circuit 30. That is, the display control signal SH is an example of the drive signal in the second embodiment, and the drive unit Drv including the control circuit 30 that outputs the display control signal SH is an example of the drive signal output circuit in the second embodiment. The display unit 34 that displays an image based on the display control signal SH is an example of the display portion and the drive portion in the second embodiment. Further, the battery 37 that supplies electric power to the mobile device M including the smartphone 3, which includes the control circuit 30, and that includes an inorganic solid-state substance including ceramic or the like as an electrolyte is an example of a solid-state battery.

2.2 Configuration of Smartphone and Battery Disposition on Smartphone 3

Next, the configuration of the smartphone 3 as the mobile device M will be described with reference to FIGS. 9 to 12. In the following description, the X axis, the Y axis, and the Z axis that are orthogonal to each other will be used for description. On the X axis, a starting point side of the illustrated arrow may be referred to as "−X side" and a front end side may be referred to as "+X side", a direction from the starting point side toward the front end side along the X axis may be referred to as "+X direction" and a direction from the front end side to the starting point side along the X axis may be referred to as "−X direction", and the "−X direction" and the "+X direction" may be collectively referred to as the "X axis direction". Similarly, on the Y axis, a starting point side of the illustrated arrow may be referred to as "−Y side" and a front end side may be referred to as "+Y side", a direction from the starting point side toward the front end side along the Y axis may be referred to as "+Y direction" and a direction from the front end side to the starting point side along the Y axis may be referred to as "−Y direction", and the "−Y direction" and the "+Y direction" may be collectively referred to as the "Y axis direction". Similarly, on the Z axis, a starting point side of the illustrated arrow may be referred to as "−Z side" and a front end side may be referred to as "+Z side", a direction from the starting point side toward the front end side along the Z axis may be referred to as "+Z direction" and a direction from the front end side to the starting point side along the Z axis may be referred to as "−Z direction", and the "−Z direction" and the "+Z direction" may be collectively referred to as the "Z axis direction". In the following description, the X axis, the Y axis, and the Z axis are described as being orthogonal to each other, but the various components of the mobile device M and the smartphone 3 are not limited to being orthogonal to each other.

Figure 9:
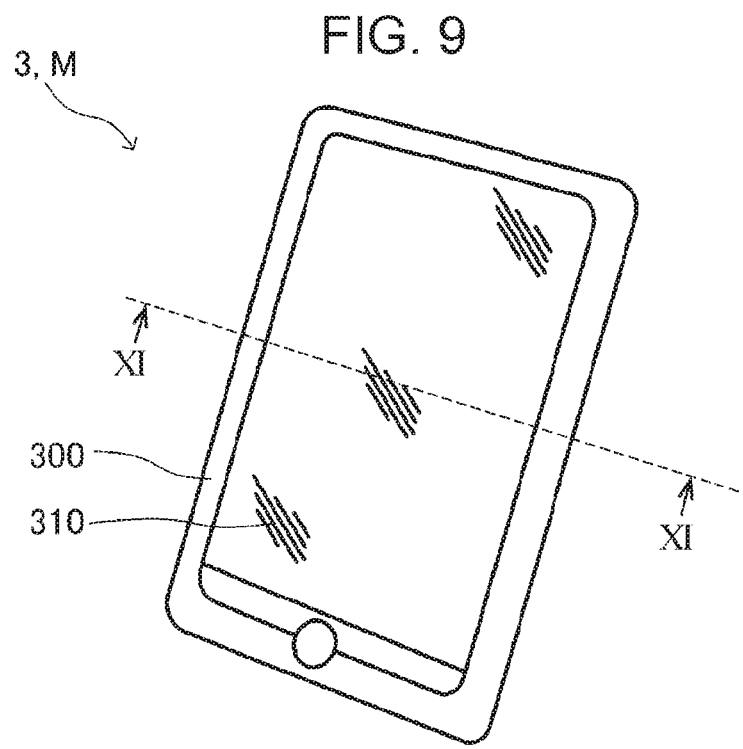
FIG. 9 is a diagram of the smartphone viewed from a front surface side provided with a display panel.
Figure 10:
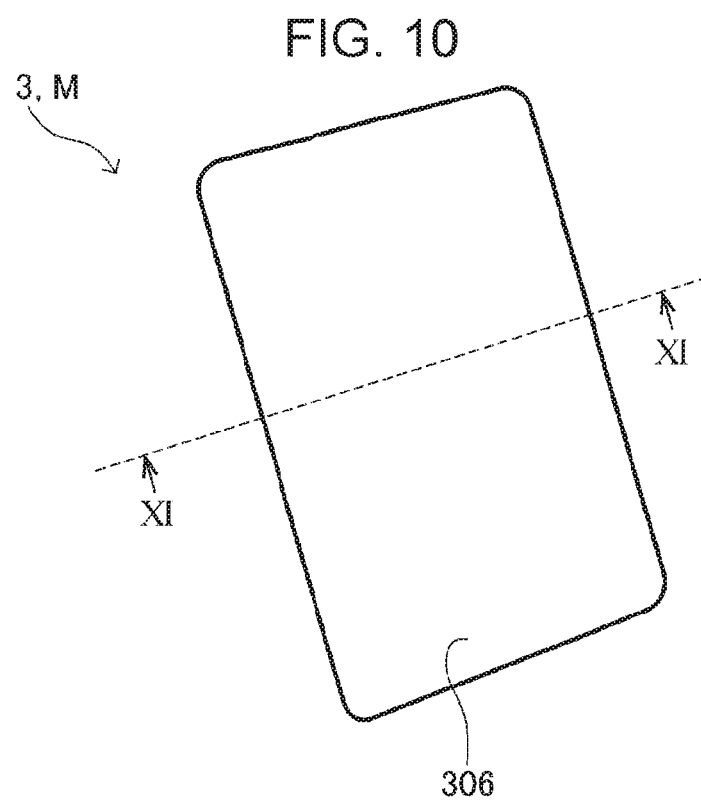
FIG. 10 is a diagram of the smartphone viewed from a back surface side that is opposite to the front surface side provided with a display panel.
Figure 11:
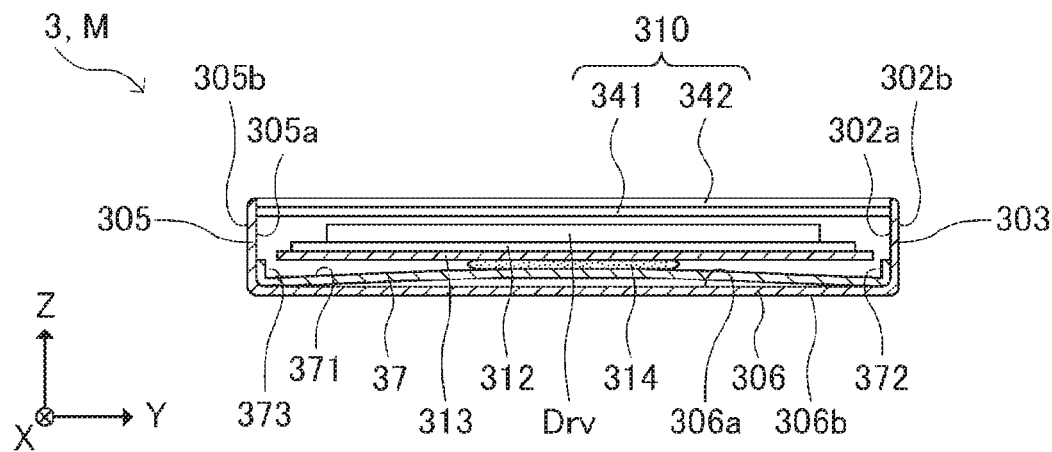
FIG. 11 is a diagram illustrating a cross-sectional structure of the smartphone when the smartphone is cut along the line XI-XI illustrated in FIGS. 9 and 10.
Figure 12:
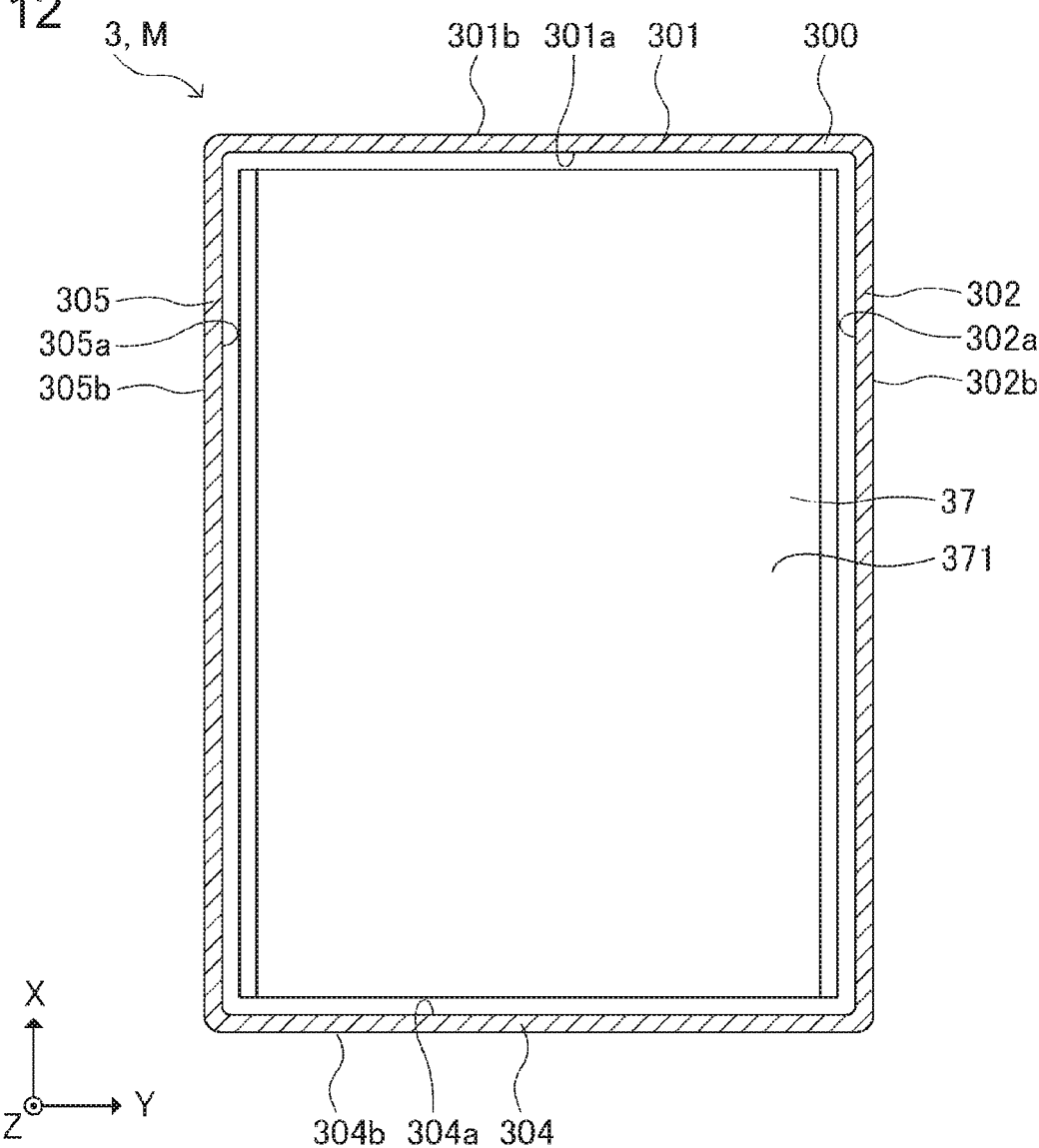
FIG. 12 is a diagram for explaining a disposition of the battery when the smartphone is viewed from the front surface side.

FIG. 9 is a diagram of the smartphone 3 viewed from a front surface side provided with a display panel 310. FIG. 10 is a diagram of the smartphone 3 viewed from a back surface side that is opposite to the front surface side provided with a display panel 310. FIG. 11 is a diagram illustrating a cross-sectional structure of the smartphone 3 when the smartphone 3 is cut along the line XI-XI illustrated in FIGS. 9 and 10. FIG. 12 is a diagram for explaining a disposition of the battery 37 when the smartphone 3 is viewed from the front surface side.

As illustrated in FIGS. 9 and 10, the smartphone 3 includes a housing 300 and a display panel 310.

As illustrated in FIGS. 11 and 12, the housing 300 includes wall portions 301, 302, 304, 305, and 306, and has a shape in which one surface is open. The wall portion 301 is positioned on the +X side of the housing 300. The wall portion 302 is positioned on the +Y side of the housing 300. The wall portion 304 is positioned on the +X side of the housing 300. The wall portion 305 is positioned on the −Y side of the housing 300. The wall portion 306 is positioned on the −Z side of the housing 300. The +Z side of the housing 300 is open. That is, the wall portion 301 and the wall portion 304 are positioned to face each other in the direction along the X axis direction, the wall portion 302 and the wall portion 305 are positioned to face each other in the direction along the Y axis direction, and the wall portion 306 and the opening of the housing 300 are positioned to face each other in the direction along the Z axis direction. In the following description, the surface of the housing 300 that is open may be referred to as an open surface. Further, the surface of the wall portion 301 positioned inside the housing 300 is referred to as an inner surface 301a, and the surface of the wall portion 301 positioned outside the housing 300 is referred to as an outer surface 301b. Similarly, the respective surfaces of the wall portions 302, 304, 305, and 306 positioned inside the housing 300 are referred to as inner surfaces 302a, 304a, 305a, and 306a, and the respective surfaces of the wall portions 302, 304, 305, and 306 positioned outside the housing 300 are referred to as outer surfaces 302b, 304b, 305b, and 306b.

A display panel 310 is provided on the opening surface of the housing 300. In other words, at least parts of the outer surface 306b and the display panel 310 are overlapped and positioned in the Z axis direction, which is a direction intersecting the direction in which the outer surface 306b of the housing 300 extends. The display panel 310 includes a display portion 341 and a sensor portion 342 stacked on the display portion 341. The display portion 341 is formed by including a liquid crystal panel, an electronic paper panel, an organic electroluminescence panel, or the like. Further, the sensor portion 342 functions as an operation portion that receives an operation by a user. A resistance film sensor, an electrostatic capacitance sensor, a front surface acoustic wave sensor, or the like is applied to the sensor portion 342. That is, the display panel 310 in the present embodiment is a so-called touch panel in which the display portion 341 and the sensor portion 342 corresponding to the operation switch are integrated. The display panel 310 corresponds to the display unit 34 operated based on the display control signal SH.

The display unit 34, the drive unit Dry, and the battery 37 are accommodated in the housing 300 of the smartphone 3 configured as described above.

A circuit substrate 312 on which the drive unit Dry is mounted is provided on the −Z side of the display panel 310. The circuit substrate 312 is supported by the substrate supporting portion 313. In other words, the smartphone 3 includes the substrate supporting portion 313 that supports the circuit substrate 312 on which the drive unit Dry is mounted, and the housing 300 also accommodates the substrate supporting portion 313. The substrate supporting portion 313 is an example of a supporting portion in the mobile device M and the smartphone 3 according to the second embodiment. The drive unit Dry mounted on the circuit substrate 312 outputs a signal for operating various components including the display unit 34.

Specifically, the substrate supporting portion 313 supports the circuit substrate 312 by fixing the circuit substrate 312 with a screw or the like. In this case, the circuit substrate 312 and the substrate supporting portion 313 are desirably fixed so as not to make electrical contact therebetween with each other, for example, the circuit substrate 312 may be fixed to the substrate supporting portion 313 in a state where an insulating member (not illustrated) interposed between the circuit substrate 312 and the substrate supporting portion 313, or the circuit substrate 312 may be fixed to the substrate supporting portion 313 by using a spacer or the like for forming a space between the circuit substrate 312 and the substrate supporting portion 313.

The battery 37 is positioned on the −Z side of the substrate supporting portion 313. In other words, the battery 37 is positioned between the wall portion 306 of the housing 300 and the substrate supporting portion 313 and between the outer surface 306b of the wall portion 306 of the housing 300 and the substrate supporting portion 313. Further, the substrate supporting portion 313 is positioned between the drive unit Dry mounted on the circuit substrate 312 and the battery 37.

The substrate supporting portion 313 and the battery 37 are fixed by a fixing member 314. In other words, the smartphone 3 includes the fixing member 314 that fixes the battery 37. The fixing member 314 may be provided so as to fix the entire surface of the battery 37 to the substrate supporting portion 313, but as illustrated in FIG. 11, is desirably provided so as to fix only a part of the battery 37 to the substrate supporting portion 313. In other words, it is desirable that at least a part of the battery 37 is not fixed to the substrate supporting portion 313. Since at least a part of the battery 37 is not fixed to the substrate supporting portion 313, the battery 37 can be deformed when a shock is applied to the smartphone 3. Further, by deforming a part of the battery 37, the shock applied to the smartphone 3 can be alleviated. As a result, the shock applied to the circuit substrate 312 can be alleviated, and the shock applied to the drive unit Dry mounted on the circuit substrate 312 is also alleviated. Such a fixing member 314 only needs to be able to fix the battery 37 to the substrate supporting portion 313, and for example, an adhesive agent, a tape, a screw or the like is used.

The battery 37 is positioned in the vicinity of the wall portion 306 of the smartphone 3. The disposition and shape of the battery 37 positioned in the vicinity of the wall portion 306 will be described in detail. The battery 37 includes a surface 371, a surface 372 connected to the surface 371, and a surface 373 connected to the surface 371 and facing the surface 372. The surfaces 371, 372, and 373 which are included in the battery 37 may be formed by bending one battery 37 having a plate shape.

The surface 371 extends in a direction in which the wall portion 306 of the housing 300 extends, that is, in a direction in which the outer surface 306b extends. The surface 372 is connected to the surface 371, and extends along the direction in which the wall portion 302 of the housing 300 extends, that is the direction in which the outer surface 302b extends. Thereby, the battery 37 is positioned between a contact point where the wall portion 306 and the wall portion 302 are connected to each other and a contact point where the outer surface 306b and the outer surface 302b are connected to each other, and the substrate supporting portion 313.

When the mobile device M including the smartphone 3 is dropped, first, the corner portion of the mobile device M is likely to come into contact with the ground or the like. Therefore, in the mobile device M including the smartphone 3, the shock is more likely to be applied to the corner portion of the housing 300 as compared with the wall portions 301, 302, 304, 305, and 306. With respect to such a shock applied to the corner portion of the housing 300, by positioning the battery 37 between the contact point where the wall portion 306 and the wall portion 302 are connected to each other and the contact point where the outer surface 306b and the outer surface 302b are connected to each other, and the substrate supporting portion 313, even when a shock is applied to the contact point, where the outer surface 306b and the outer surface 302b of the mobile device M are connected to each other, the shock applied to the circuit substrate 312 is alleviated by the battery 37. As a result, the possibility that an abnormality occurs in the drive unit Dry, which is mounted on the circuit substrate 312, is reduced, and the possibility that an abnormality occurs in the operation of the mobile device M including the drive unit Dry is reduced.

The surface 373 is connected to the surface 371, and extends along the direction in which the wall portion 305 of the housing 300 extends, that is the direction in which the outer surface 305b extends. In other words, the battery 37 is positioned between the contact point where the wall portion 306 and the wall portion 305 are connected to each other and the contact point where the outer surface 306b and the outer surface 305b are connected to each other, and the substrate supporting portion 313.

When the mobile device M including the smartphone 3 is dropped, first, the corner portion of the mobile device M is likely to come into contact with the ground or the like. Therefore, in the mobile device M including the smartphone 3, the shock is more likely to be applied to the corner portion of the housing 300 as compared with the wall portions 301, 302, 304, 305, and 306. With respect to such a shock applied to the corner portion of the housing 300, by positioning the battery 37 between the contact point where the wall portion 306 and the wall portion 305 are connected to each other and the contact point where the outer surface 306b and the outer surface 305b are connected to each other, and the substrate supporting portion 313, even when a shock is applied to the contact point, where the outer surface 306b and the outer surface 305b of the mobile device M are connected to each other, the shock applied to the circuit substrate 312 is alleviated by the battery 37. As a result, the possibility that an abnormality occurs in the drive unit Dry, which is mounted on the circuit substrate 312, is reduced, and the possibility that an abnormality occurs in the operation of the mobile device M including the drive unit Dry is reduced.

The surface 371 of the battery 37 extending along the outer surface 306b of the housing 300 is an example of a first battery surface in the second embodiment, the surface 372 of the battery 37 extending along the outer surface 302b of the housing 300 is an example of a second battery surface in the second embodiment, and the surface 373 of the battery 37 extending along the outer surface 305b of the housing 300 is another example of the second battery surface in the second embodiment. Further, among the housing 300 included in the smartphone 3, the outer surface 306b, which is a surface of the outside of the wall portion 306, is an example of a first housing surface in the second embodiment, and at least one of the outer surface 302b that is a surface of the outside of the wall portion 302 connected to the wall portion 306 and the outer surface 305b that is a surface of the outside of the wall portion 305 connected to the wall portion 306 is an example of a second housing surface in the second embodiment.

Even the mobile device M and the smartphone 3 according to the second embodiment configured as described above can achieve the same operational effects as the mobile device M and the mobile printer 1 according to the first embodiment.

3. Other Embodiments

Although the mobile device M of the first embodiment described above exemplifies the mobile printer 1 as a portable liquid discharging apparatus, and the mobile device M of the second embodiment exemplifies the smartphone 3 as a display apparatus for description, the mobile device M may be any device that can be carried and driven by a battery, and may be applied to various mobile devices M such as a tablet terminal, a mobile phone, a computer, and a digital audio player. Even in such a case, it is possible to obtain the same operational effects as those of the first and second embodiments.

As mentioned above, although embodiment and modification example are demonstrated, the present disclosure is not limited to these embodiments and can be implemented in various modes without departing from the gist thereof. For example, the above-described embodiments can be appropriately combined.

The present disclosure includes configurations that are substantially the same as the configurations described in the embodiments (for example, configurations that have the same functions, methods, and results, or configurations that have the same objects and effects). The present disclosure includes a configuration in which a non-essential part of the configuration described in the embodiment is replaced. The present disclosure includes a configuration that exhibits the same operational effects as the configuration described in the embodiment or a configuration that can achieve the same object. In addition, the present disclosure includes a configuration in which a known technique is added to the configuration described in the embodiment.

What is claimed is:

1. A mobile device comprising:
   a drive signal output circuit outputting a drive signal;
   a drive portion operating based on the drive signal;
   a solid-state battery supplying electric power to the drive signal output circuit;
   a supporting portion supporting the drive signal output circuit; and
   a housing accommodating the drive signal output circuit, the drive portion, the solid- state battery, and the supporting portion, wherein
   the housing includes a first housing surface,
   the supporting portion is positioned between the first housing surface and the drive signal output circuit, and
   the solid-state battery is positioned between the first housing surface and the supporting portion.

2. The mobile device according to claim 1, wherein
   the housing includes a second housing surface that is connected to the first housing surface, and
   the solid-state battery is positioned between a contact point, where the first housing surface and the second housing surface are connected to each other, and the supporting portion.

3. The mobile device according to claim 2, wherein
   the solid-state battery includes
   a first battery surface that extends along a direction in which the first housing surface extends, and
   a second battery surface that is connected to the first battery surface and extends along a direction in which the second housing surface extends.

4. The mobile device according to claim 1, further comprising:
   a fixing portion fixing the solid-state battery, wherein
   the fixing portion fixes only a part of the solid-state battery.

5. The mobile device according to claim 4, wherein
   the fixing portion fixes the part of the solid-state battery to the supporting portion.

6. The mobile device according to claim 1, wherein
   the supporting portion is positioned between the drive signal output circuit and the solid-state battery.

* * * * *